(12) United States Patent
Krakovinsky et al.

(10) Patent No.: US 10,355,207 B2
(45) Date of Patent: Jul. 16, 2019

(54) METHOD FOR FORMING A NON-VOLATILE MEMORY CELL, NON-VOLATILE MEMORY CELL FORMED ACCORDING TO SAID METHOD AND MICROELECTRONIC DEVICE COMPRISING SUCH MEMORY CELLS

(71) Applicants: COMMISSARIAT A L'ENERGIE ATOMIQUE ET AUX ENERGIES ALTERNATIVES, Paris (FR); UNIVERSITE D'AIX-MARSEILLE, Marseilles (FR); CENTRE NATIONAL DE LA RECHERCHE SCIENTIFIQUE (CNRS), Paris (FR)

(72) Inventors: Alexis Krakovinsky, Gardanne (FR); Marc Bocquet, Marseilles (FR); Jean Coignus, Grenoble (FR); Vincenzo Della Marca, St Victoret (FR); Jean-Michel Portal, Saint-Savournin (FR); Romain Wacquez, Marseilles (FR)

(73) Assignees: COMMISSARIAT A L'ENERGIE ATOMIQUE ET AUX ENERGIES ALTERNATIVES, Paris (FR); UNIVERSITE D'AIX-MARSEILLE, Marseilles (FR); CENTRE NATIONAL DE LA RECHERCHE SCIENTIFIQUE (CNRS), Paris (FR)

( * ) Notice: Subject to any disclaimer, the term of this patent is extended or adjusted under 35 U.S.C. 154(b) by 0 days.

(21) Appl. No.: 15/927,635

(22) Filed: Mar. 21, 2018

(65) Prior Publication Data

US 2018/0277760 A1    Sep. 27, 2018

(30) Foreign Application Priority Data

Mar. 23, 2017 (FR) ...................................... 17 52398

(51) Int. Cl.
*G11C 11/00* (2006.01)
*H01L 45/00* (2006.01)
(Continued)

(52) U.S. Cl.
CPC ........ *H01L 45/1641* (2013.01); *G11C 13/004* (2013.01); *G11C 13/0007* (2013.01);
(Continued)

(58) Field of Classification Search
CPC ............ G11C 13/0069; G11C 13/0004; G11C 13/0007; G11C 2213/79; G11C 11/4091
(Continued)

(56) References Cited

U.S. PATENT DOCUMENTS

2007/0133264 A1* 6/2007 Hosomi .................. G11C 11/16
                                                                  365/158
2013/0044534 A1   2/2013 Kawai et al.
(Continued)

FOREIGN PATENT DOCUMENTS

JP     2007-134512 A    5/2007
WO  WO 2010/087836 A1  8/2010

OTHER PUBLICATIONS

Sarafianos, A., Injection de fautes par impulsion laser dans les circuits sécurisés, Doctorate Thesis, 2013, 219 pages [relevant portion : p. 91 (« II.2.1.2 II.2.1.2 Measurements and electrical model at high pulsed laser power») to p. 95 (at the beginning of the section « II.2.1.2.2 Comparison between electrical simulation and measurements »).

(Continued)

*Primary Examiner* — Son T Dinh
(74) *Attorney, Agent, or Firm* — Pillsbury Winthrop Shaw Pittman LLP

(57) ABSTRACT

A method for forming a non-volatile memory cell intended to switch the memory cell from an unformed state to a
(Continued)

formed state, the memory cell including an ordered stack of a lower electrode, a layer of insulating material and an upper electrode. The forming method includes a breakdown operation in which at least one laser shot is emitted towards the layer of insulating material to make the layer of insulating material active by making it pass from a high resistance state to a low resistance state, the memory cell being formed when the layer of insulating material is active.

13 Claims, 2 Drawing Sheets

(51) Int. Cl.
　　　G11C 13/00　　　(2006.01)
　　　H01L 21/66　　　(2006.01)
　　　H01L 27/24　　　(2006.01)
　　　G11C 7/00　　　　(2006.01)
　　　G11C 13/04　　　(2006.01)
(52) U.S. Cl.
　　　CPC .......... *G11C 13/0069* (2013.01); *H01L 22/20* (2013.01); *H01L 27/2463* (2013.01); *H01L 45/1233* (2013.01); *H01L 45/1253* (2013.01); *H01L 45/146* (2013.01); *G11C 7/005* (2013.01); *G11C 13/04* (2013.01); *G11C 2013/0083* (2013.01); *G11C 2213/32* (2013.01); *G11C 2213/52* (2013.01)
(58) Field of Classification Search
　　　USPC ................................................. 365/158, 174
　　　See application file for complete search history.

(56) References Cited

U.S. PATENT DOCUMENTS

2013/0322152 A1　　12/2013　Kuhn
2016/0329086 A1*　11/2016　Kanai ................. G11C 11/1675

OTHER PUBLICATIONS

Search Report as issued in French Patent Application No. 1752398, dated Nov. 9, 2017.
Huet, K., et al., "Laser Thermal Annealing: A low thermal budget solution for advanced structures and new materials," 2014 International Workshop on Junction Technology (IWJT), May 2014, pp. 1-6, XP032611263.
Vianello, E., et al., "Resistive Memories for Ultra-Low-Power embedded computing design," 2014 IEEE International Electron Devices Meeting, Dec. 2014, XP032738121, 4 pages.
Traore, B. et al., "On the forming-free operation of $HfO_x$ based RRAM devices: Experiments and ab initio calculations," Solid-State Device Research Conference (ESSDERC), 2013 Proceedings of the European, Bucharest, 2013, pp. 170-173.
Retamal, D., et al., "Effect of ultraviolet illumination on metal oxide resistive memory," Applied Physics Letters, 105, 253111 (2014), DOI:http://dx.doi.org/10.1063/1.4904396, 6 pages.
Krakovinsky, A., et al., "Impact of a Laser Pulse on $HfO_2$-based RRAM Cells Reliability and Integrity," ICMTS, 2016, 5 pages.
Zhao, L., et Al., "Dynamic Modeling and Atomistic Simulations of Set and Reset Operations in $TiO_2$-Based Unipolar Resistive Memory," IEEE Electron Device Letters, vol. 32, No. 5, May 2011, 3 pages.

* cited by examiner

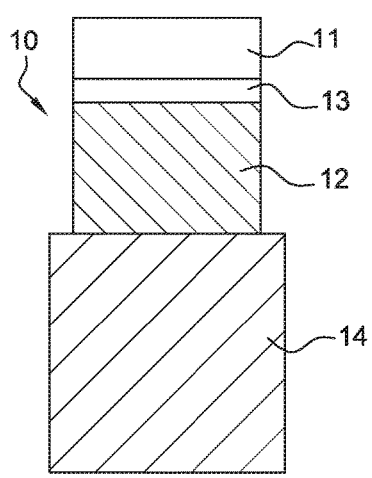
Fig. 1
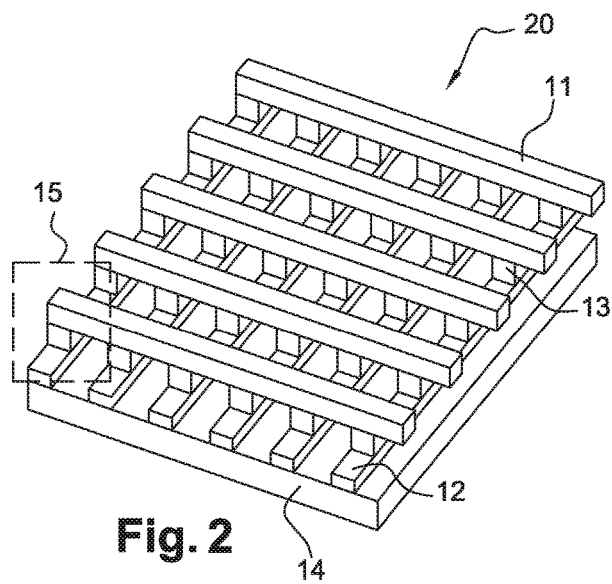
Fig. 2
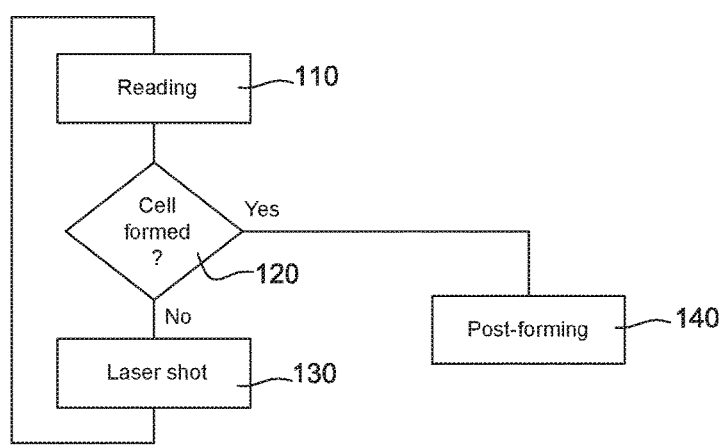
Fig. 3
| | Writing | Erasing | Reading |
|---|---|---|---|
| Substrate | 0V | 0V | 0V |
| Source (Lower electrode) | 0V | Sweep up to 2V | 0V |
| Drain (Upper electrode) | Sweep up to 2V | 0V | Sweep up to 0.1V |
| Gate | 1.1V | 2.5V | 3V |
Fig. 4

METHOD FOR FORMING A NON-VOLATILE
MEMORY CELL, NON-VOLATILE MEMORY
CELL FORMED ACCORDING TO SAID
METHOD AND MICROELECTRONIC
DEVICE COMPRISING SUCH MEMORY
CELLS

CROSS-REFERENCE TO RELATED APPLICATION

This application claims priority to French Patent Application No. 1752398, filed Mar. 23, 2017, the entire content of which is incorporated herein by reference in its entirety.

TECHNICAL FIELD

The present invention relates to a method for forming a non-volatile memory cell. The invention also relates to a non-volatile memory cell formed according to said method and a microelectronic device comprising such memory cells. The invention finds applications in the field of non-volatile rewritable memories and, more specifically, that of resistive random access memories of OxRRAM (Oxide-based Resistive RAM) type.

PRIOR ART

In the field of non-volatile rewritable memories, different types of memories are used as a function of the targeted applications and performances. The most widely used memories, in particular in digital photograph devices, cell phones, portable computers, USB keys, and other portable devices, are memories called "Flash memories". Flash memories offer, notably, high integration density, great impact resistance and good durability.

Most commercially available non-volatile Flash memories use charge storage as principle for encoding information. In practice, a charge trapping layer (generally polysilicon, or a dielectric such as SiN) is encapsulated between two dielectrics in the gate stack of an MOS transistor. The presence or the absence of charge in this medium modifies the conduction of the MOS transistor and makes it possible to encode the state of the memory.

However, the evolution of microelectronics necessitates ever greater miniaturisation of components and, in particular, non-volatile rewritable memories. Yet, the miniaturisation of Flash technology is limited, notably by the fact that the thickness of the charge trapping layer cannot be reduced below a minimum value (of the order of 6 nm) at the risk of decreasing the information retention time.

Recently, a novel type of memory, called resistive random access memories, have appeared to replace Flash memories. These resistive random access memories are not based on charge trapping of the gates of transistors, but on a change of state of a resistive block. Resistive random access memories, notably oxide based resistive random access memories OxRRAM, are based on a change of the resistance state (high or low resistance) of an active material integrated between two metal electrodes. This new type of memory enables not only high integration density, but also high operating speed, great endurance and good compatibility with the manufacturing methods currently used in the microelectronics industry, in particular with end of line CMOS technology methods.

A resistive random access memory generally includes a plurality of memory cells, also called memory points. Each memory cell comprises a resistive block such as a memristor formed of a first and a second electrode, generally made of metal, and a layer made of active material, for example a metal oxide, arranged between the two electrodes. An example of resistive random access memory cell of OxRRAM type is represented in FIG. 1. This resistive random access memory 10 comprises a first electrode 11, a second electrode 12 and a layer made of active material 13 laid out between the first and second electrodes. The second electrode 12 of the resistive random access memory 1 is arranged in contact with a connector substrate 14 ensuring electrical contact between a selection device (not represented in FIG. 1) and the memory cell. The selection device, for example a transistor, makes it possible to control the voltage or the current applied to the electrodes 11 and 12 of the memristor.

The layer of active material 13, generally an initially insulating material, is capable of switching, in a reversible manner, between two resistance states which correspond to the logic values "0" and "1" used to encode an information bit. Thus, a resistive random access memory cell can switch from a low resistance state (LRS) to a high resistance state (HRS) by the application of a first voltage VRESET between the first 11 and the second 12 electrodes, and to switch back from the high resistance state HRS to the low resistance state LRS by the application of a second voltage VSET between the first and second electrodes. In particular, information is written in the memory cell by switching the layer made of active material from the high resistance state HRS, also called "OFF" state, to the low resistance state LRS, or "ON" state. Conversely, information may be erased from the memory cell by switching the layer made of active material from the LRS state to the HRS state. The operation of writing in the memory cell is called "SET"; the operation of erasing said memory cell is called "RESET".

The change in resistance of the active material is governed by the formation and the rupture of a conductive filament of nanometric section between the two electrodes 11-12. Given our current state of knowledge, this filament seems to be due to different phenomena, depending on the type of material used for the layer of active material. In particular, in a resistive random access memory of OxRRAM type in which the layer of active material is oxide based, the change of resistance state seems to be explained by the formation of a filament of oxygen vacancies within said layer of active material.

In an initial state, that is to say after manufacture but before forming the memory cell, the layer of active material 13 is insulating. The layer of insulating material is made active by the forming method carried out before use of the memory cell. This forming method consists, generally, in carrying out a partially reversible breakdown of the insulating material in order to generate, for the first time, a conductive low resistance state LRS in said layer of material 13. The breakdown makes it possible to initiate the creation of the conductive filament in the layer of material 13. After breakdown, the initially insulating material becomes active and the resistance of said material may be modulated in order to pass from a LRS state to a HRS state, and vice versa.

Generally, the operation of breakdown of the insulating material comprises the application of a first electrical stress to the virgin memory cell. This electrical stress has to be realised at a voltage of value much greater than the nominal operating voltage of said memory cell, for example a voltage of the order of 2.5V for a nominal voltage of the order of 1.5V.

Yet, the use of such potential levels may be harmful for components neighbouring the layer of active material 13 and, for example, deteriorate the selection device designed to operate at lower potentials. The use of such potential levels thus requires a specific design—relatively costly—making it possible to protect the selection device and other optional neighbouring components, said specific design being all the more costly when it is provided to be used only once during the life of the resistive random access memory (for the forming operation).

To respond to this problem of too high forming voltage, it has been proposed to use memory cells in which the layer of active material is of low thickness (typically less than 3 nm). Such a proposition is described, notably, in the document of B. Traore et al., entitled "On the forming-free operation of HfOx based RRAM devices: Experiments and ab initio calculations", *Solid-State Device Research Conference (ESSDERC)*, 2013 *Proceedings of the European*, Bucharest, 2013, pp. 170-173. However, if this low thickness of the layer of active material makes it possible to realise a breakdown at a potential level substantially similar to the potentials used for the writing operation, the structure obtained is much less stable than that of a memory cell having a thick layer of insulating material. Indeed, due to the low thickness of the layer of active material, the resistance levels of the high resistance state (HRS) and the low resistance state (LRS) are variable and thus unstable. Such memory cells are thus not viable on a long-term basis.

Techniques based on the exposure of memory cells to external means such as temperature or UV radiation have been studied to improve the stability of the low resistance and/or high resistance states of the layer of active material. The document of A. Krakovinsky et al., entitled "*Impact of a Laser Pulse On HfO2-based RRAM Cells Reliability and Integrity*", ICMTS 2016, proposes, for example, carrying out an operation of writing a resistive random access memory cell by means of a laser. However, these techniques aim to improve the stability of the resistive states of the layer of active material of a formed memory cell. These techniques do not enable the forming of resistive memory cells.

SUMMARY OF THE INVENTION

To respond to the problem described above of too high forming voltages to be withstood by selection devices, the Applicant proposes a method for forming a resistive random access memory cell in which the breakdown operation is carried out by at least one laser shot.

According to a first aspect, the invention relates to a method for forming a non-volatile memory cell intended to switch said memory cell from an unformed state to a formed state, said memory cell including an ordered stack of a lower electrode, a layer of insulating material and an upper electrode. This method is characterised by the fact that it comprises a breakdown operation in which at least one laser shot is emitted towards the layer of insulating material to make said layer of insulating material active by making it pass from a high resistance state (HRS state) to a low resistance state (LRS state), the memory cell being formed when the layer of insulating material is active, several laser shots being able to be emitted successively towards the layer of insulating material (13) with, each, a laser shot power flux density greater than the laser shot power flux density of the preceding laser shot.

Such an operation of breakdown of the layer of insulating material by laser shot has the advantage of being able to be implemented on memory cells not supplied electrically. This breakdown operation thus makes it possible to avoid the use of high potential levels and the harmful consequences that they can cause. It also makes it possible to form the memory cell without necessitating any specific design, which enables cheaper forming than forming by application of an electrical stress.

In the description that follows, the expressions "layer of insulating material", "layer of active material" and "active material" describe the same layer of material comprised between the lower electrode and the upper electrode, obviously that this layer of material is highly resistive (and thus substantially insulating) in the initial state and in the HRS state and weakly resistive (and thus electrically conducting) in the LRS state. Those skilled in the art will understand that this layer of material is considered as active because, after breakdown, it is capable of passing, in a reversible manner, from a high resistance state to a low resistance state as a function of the voltage applied to the terminals of the lower and upper electrodes.

Advantageously, the forming method comprises the following steps:
a) reading the memory cell,
b) detecting the formed or unformed state of said memory cell,
c) when the memory cell is in an unformed state, implementing laser shots,
d) when the memory cell is in a formed state, carrying out a post-forming cycle to place said cell in an operating state.

This alternative of the forming method not only makes it possible to make the memory cell pass from an unformed state to a formed state, but also to place the formed memory cell in an operating state.

According to certain embodiments, steps a)-c) are repeated as long as the memory cell is in an unformed state, the power flux density of the laser shot being increased at each repetition of step c).

The fact of increasing the power flux density of the laser shot bit by bit enables optimal breakdown of the memory cells in which each memory cell is formed with the power flux density level that is required by it.

According to certain embodiments, the post-forming cycle of step d) comprises several cycles, successive and reversible, of switching between the HRS state and the LRS state.

According to certain embodiments, the breakdown operation is carried out with a laser of a power flux density comprised between 0.06 and 0.12 W/$\mu m^2$.

According to certain embodiments, the breakdown operation is carried out with a laser beam of a diameter greater than three times the width and/or the length of the memory cell. Such a diameter makes it possible to ensure breakdown of the entire surface of the layer of insulating material.

According to certain embodiments, the breakdown operation is carried out with a laser in which the pulses have a duration less than or equal to 1 µs.

According to certain embodiments, the breakdown operation is carried out with a laser beam emitted in a wavelength of the infrared or the ultraviolet.

According to a second aspect, the invention relates to a non-volatile memory cell including an ordered stack of a lower electrode, a layer of insulating material and an upper electrode. Said memory cell is characterised by the fact that the layer of insulating material is made active by a forming method as defined above such that said layer of insulating material is capable, after forming, to switch in a reversible manner between a high resistance state (HRS state) and a low resistance state (LRS state).

Such a memory cell thus has intrinsic characteristics similar to those of a memory cell formed by a forming method by application of an electrical stress.

According to certain embodiments, the upper electrode is made of titanium (Ti), the lower electrode is made of titanium nitride (TiN) and the layer of insulating material is made of hafnium oxide ($HfO_2$).

According to certain embodiments, the memory cell comprises a selection device, connected to the stack of the lower electrode, the layer of insulating material and the upper electrode, to control the current flowing in said stack.

According to a third aspect, the invention relates to a microelectronic device comprising a plurality of memory cells as defined previously, laid out beside each other.

According to certain embodiments, the memory cells of the microelectronic device are laid out in a crossbar type architecture.

BRIEF DESCRIPTION OF THE FIGURES

Other advantages and characteristics of the invention will become clear from reading the description, illustrated by the figures in which:

FIG. 1, already described, schematically represents an example of resistive random access memory cell of OxR-RAM type;

FIG. 2 schematically represents an example of a microelectronic device comprising several resistive random access memory cells according to the invention;

FIG. 3 schematically represents the functional diagram of the method for forming a resistive random access memory cell according to the present invention;

FIG. 4 represents, in the form of a table, examples of voltage values to apply to a memory cell in phases of writing and erasing said cell;

DETAILED DESCRIPTION OF AT LEAST ONE EMBODIMENT

Figure 5A:
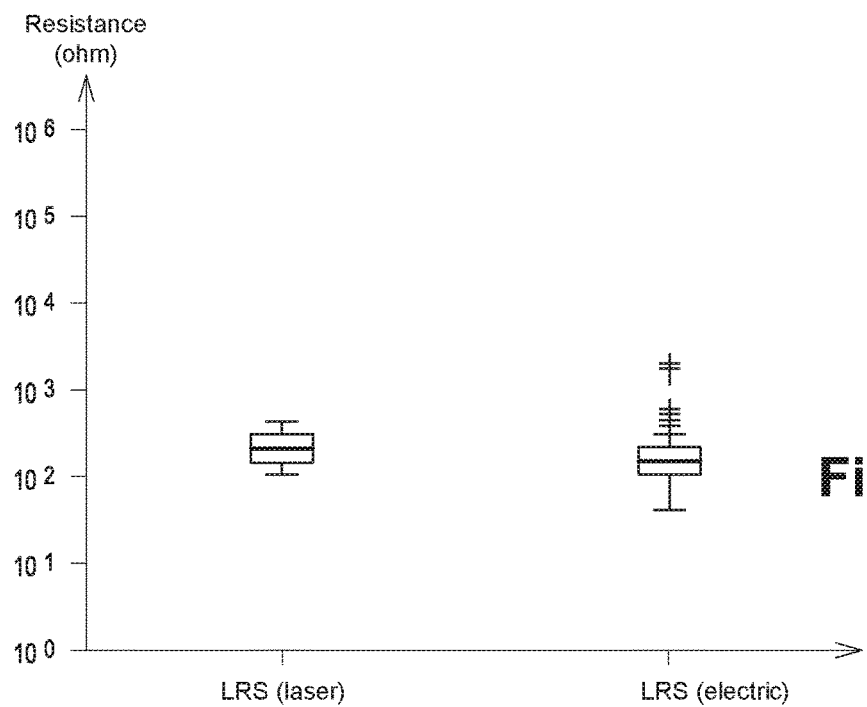
FIGS. 5A and 5B represent examples of values of resistances, respectively in the HRS state and in the LRS state, obtained by a memory cell formed by the forming method according to the invention.

An example of a method for forming a resistive random access memory cell implemented by emission of at least one laser shot is described in detail hereafter, with reference to the appended drawings. This example illustrates the characteristics and advantages of the invention. It is however recalled that the invention is not limited to this example.

In the figures, identical elements are marked by identical references. For reasons of legibility of the figures, the size scales between elements represented are not respected.

A microelectronic device according to the invention, also called resistive random access memory, is represented in FIG. 2. This microelectronic device 20 comprises a plurality of resistive random access memory cells 10, indiscriminately called non-volatile memory cells or simply memory cells. This plurality of memory cells 10—of the type of the memory cell represented in FIG. 1—are laid out beside each other, on one or several stages. In the example of FIG. 2, the memory cells 10 are laid out according to a crossbar architecture, in which several upper electrodes 11 are laid out parallel to each other in a first plane and several lower electrodes 12 are laid out parallel to each other and perpendicularly to the upper electrodes 11, in a second plane parallel to the first plane. A layer of active material 13 is arranged at each intersection between a lower electrode and an upper electrode. Each stack constituted of a portion of lower electrode 12, a portion of upper electrode 11 and a layer of active material 13 forms a memristor 15. Each memristor 15 is associated with a selection device, not represented in FIG. 2, so as to form a memory cell such as that represented in FIG. 1.

The lower 12 and upper 11 electrodes are metal electrodes, for example made of titanium (Ti) for the upper electrode 11 and titanium nitride (TiN) for the lower electrode 12. The upper 11 and lower 12 electrodes may obviously be made of other materials normally used in RRAM (Resistive Random Access Memory) cells such as tantalum (Ta) or tantalum nitride (TaN).

The layer of active material 13 is a layer of originally insulating material such as hafnium oxide ($HfO_2$). This layer may have a thickness, for example, of 10 nm. This active material, originally insulating, is capable of becoming conductive after a breakdown operation which will be described hereafter. Thus, under the effect of a voltage applied to the upper and lower electrodes, the layer of active material 13 becomes high resistance or low resistance, according to the level of voltage applied.

In a particular example of application, the microelectronic device 20 comprises a plurality of resistive memory cells 10 laid out according to a crossbar architecture. In the example of FIG. 2, each memory cell of the microelectronic device is of dimensions 3 μm by 3 μm and comprises an active layer 13 made of hafnium oxide of 10 nm. Each memory cell 10 of the microelectronic device also comprises a selection device connected to the memristor 15 to control the level of current applied to said memristor. In certain embodiments, the selection device is a transistor of N6MOS body-contacted P+ type, comprising a gate width of 0.35 μm and an active zone width of 100 μm. The gate width is an important parameter in the choice of the selection transistor because it is this gate which determines the maximum current—called compilance current—allowed in the memory cell. Indeed, a sufficiently high current, for example a maximum current of 3 mA, must be able to traverse the gate of the transistor to enable reversible switching of the memory cell between the LRS state and the HRS state; this current must however be limited in order to prevent the creation of a permanent conductive filament in the layer of active material.

To write, erase and/or rewrite in a resistive memory cell 10, said memory cell has to be formed, that is to say that the layer of active material 13 must have been "broken down" during a breakdown operation in order that said layer of active material can be at least partially conducting. This breakdown operation consists in initiating the creation of the conductive filament in the layer of active material 13 such that said active material is capable of switching from a low resistance state (LRS state) to a high resistance state (HRS state), or vice versa.

This breakdown operation is carried out during the forming method according to the invention, schematically represented in FIG. 3. This forming method, referenced 100, comprises a step 110 of reading a memory cell. Indeed, during the phase of production of a microelectronic device such as that of FIG. 2, each memory cell of the microelectronic device is read to check that it is unformed or, conversely, formed. Thus, each memory cell is read at step 110 and a test of checking the formed or unformed state of said memory cell is carried out at step 120. If the memory cell is determined as unformed, then the method continues by a step 130 of laser shot. A first laser shot is conducted with a predetermined power flux density, for example 0.03 W/μ2. After this first laser shot, the memory cell is again read at step 110 to check if this laser shot has made it possible to break down the layer of active material 13 so as to form the memory cell. If at test 120, the memory cell is detected as still unformed, then a second laser shot (step 130) is carried out on the layer of active material 13, with a power flux density greater than the power flux density of the first laser shot. Steps 110-130 are thereby reiterated, with a laser shot power flux density that increases at each iteration, up to breakdown of the layer of active material 13. The increase in the power flux density between each shot may be carried out with a step, for example of 0.01 W/µ² up to a value, for example, of 0.12 W/µ². In other words, steps 110-130 are repeated until the memory cell is detected as formed at step 120.

Each laser shot produces, on the memory cell, a rise in temperature which is behind the breakdown of the layer of active material. Indeed, the impact of a laser beam on a layer of oxide based active material generates a thermal effect (or rise in temperature) capable of creating the conductive filament in the layer of active material. The higher the power flux density of the laser beam, the more heat is released by the laser shot. The method of the invention proposes applying a predetermined base power flux density, for example 0.03 W/µ², and to increase this power flux density step by step until the heat released by the laser shot causes breakdown.

In the method of FIG. 3, when the memory cell is detected, at step 120, as being formed, then a post-forming cycle is conducted on the memory cell at step 140. This post-forming cycle 140 consists in making the memory cell switch from an HRS state to a LRS state, and vice versa, several times in a row (for example ten or so times), so as to place the memory cell in operating state. Examples of voltages applied during this post-forming cycle are represented in FIG. 4. Indeed, as a function of the voltage applied to the memory cell, the layer of active material 13 passes into a HRS state or into a LRS state. The table of FIG. 4 shows examples of voltages applied to the lower electrode 12, via the source of the selection transistor, to the upper electrode 11 via the drain of the transistor, to the gate of the transistor and to the substrate 14. According to this example, during reading of the memory cell 10, a voltage of 0V is applied to the substrate and to the lower electrode, a voltage of 3V is applied to the gate and a sweep voltage going up to 0.1V is applied to the upper electrode. During the phase of writing the memory cell, a voltage of 0V is applied to the substrate and to the lower electrode, a voltage of 1.1V is applied to the gate and a sweep voltage going up to 2V is applied to the upper electrode. During the phase of erasing the memory cell, a voltage of 0V is applied to the substrate and to the upper electrode, a voltage of 2.5V is applied to the gate and a sweep voltage going up to 2V is applied to the lower electrode.

The operation of breakdown of the layer of active material 13 is implemented by means of a laser beam in which certain parameters are predefined as a function of the memory cell considered. One of these parameters is the power per unit area. This power per unit area, which determines the impact of the laser beam on the memory cell, is defined as a function of several criteria such as the dimensions of the memory cell and the active material used. This power per unit area may be, for example, a power comprised between 0.06 and 0.12 W/µm². The dimension of the spot of the laser beam, that is to say the dimension of the spot of the beam impacting the memory cell, is also a predefined parameter, notably as a function of the size of the memory cell and the type of active material chosen. The diameter of the laser spot is chosen, for example greater than three times the dimension of the memristor, so as to concentrate the major part of the power of the laser beam in the layer of active material encompassing the conductive filament. For example, in one embodiment where the memristor has a width and a length of 3 µm each, the laser spot could be chosen with a diameter equal to or greater than 9 µm. The pulse duration of the laser beam is an additional parameter, defined as a function of criteria such as the dimensions of the memory cell and the choice of materials. The pulse duration is determined in such a way as to maintain the integrity of the memory cell and not to damage materials situated around the layer of active material such as electrodes and connection materials. This pulse duration may be, for example, less than or equal to 1 µs.

The forming method of the invention may be implemented at several wavelengths. For example, the laser source can emit beams at a wavelength in the ultraviolet (wavelength comprised between around 100 and 400 nm) or in the infrared (wavelength comprised between around 800 and 1400 nm).

In the embodiment where the memristor has a width and a length of 3 µm each, the laser shots may, for example, be realised with a laser spot of 50×50 µm², emitted with a laser source of Nd-Yag (yttrium-aluminium garnet doped with neodymium) type in which the pulse, for 10 ns, can reach a power flux density of 7.2 W/µ², in a wavelength of 355 nm or 1064 nm.

The breakdown of the layer of active material 13 may be obtained for a power flux density comprised between around 0.022 and 0.09 W/µ². The value of the laser power necessary to break down the layer of active material, called "breakdown threshold", is variable from one memory cell to another. Indeed, since a resistive random access memory cell is an analogue component, there exists, as for any analogue component, a certain variability of reaction. This variability is further accentuated as a function of the materials used to manufacture the memory cell. In the embodiment of the memristor described previously, the breakdown threshold of certain memory cells of the microelectronic device 20 may be 0.025 W/µ² in the infrared (or 0.022 W/µ² in the ultraviolet), that of other cells may be 0.06 W/µ² in the infrared (or 0.047 W/µ² in the ultraviolet) or instead 0.09 W/µ² in the infrared (or 0.072 W/µ² in the ultraviolet). This variability, substantially identical in the infrared and in the ultraviolet, is anticipated, in the method of the invention, by a step by step determination of the breakdown threshold, carried out by increasing the power flux density of the laser shot at each iteration of step 130 of the method of FIG. 3. The step by step determination of the breakdown threshold thus makes it possible to realise an optimal breakdown of each memory cell with the power flux density the most appropriate for said memory cell. The step by step determination of the breakdown threshold further makes it possible to not have to control the current during the breakdown operation. The operation of breakdown by laser shot may thus be implemented while the memory cell is not receiving voltage, that is to say that it is not supplied electrically.

Figure 5B:
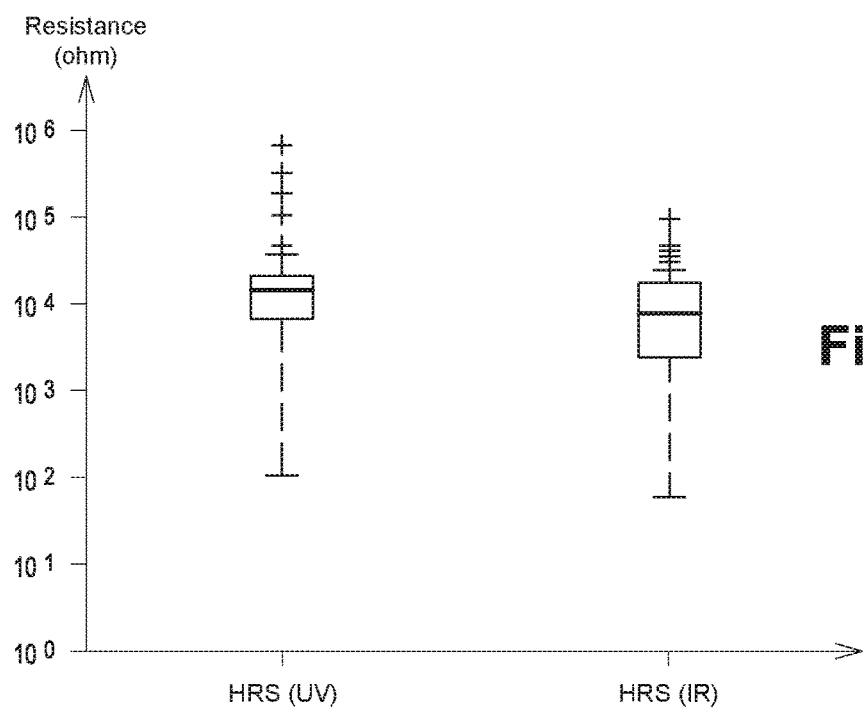

With optimal breakdown, the resistances values of the layers of active material obtained after breakdown are optimal, that is to say of the order of 200Ω in the LRS state and of the order of 10 kΩ in the HRS state, as represented in FIGS. 5A and 5B. In particular, FIG. 5A shows that the average value of the resistances obtained with the breakdown according to the method of the invention, in the LRS state, is close to the average value of the resistances obtained with a conventional method of breakdown by application of a forming voltage. FIG. 5A thus shows that the method according to the invention makes it possible to obtain a resistive level of the memory cells similar to that obtained with a conventional forming method, without however risking damaging neighbouring components. FIG. 5A also shows that the values of the resistances obtained with the breakdown according to the method of the invention are more concentrated, and thus closer to each other, than the resistance values obtained with a conventional breakdown method.

FIG. 5B shows that the average value of the resistances obtained with a breakdown realised by a laser emitting in the infrared spectrum, in the HRS state, is close to the average value of the resistances obtained with a breakdown realised by a laser emitting in the ultraviolet spectrum.

Thus, the method according to the invention enables the forming of memory cells not supplied electrically and thus without risk of over-breakdown by application of a too high voltage. The method according to the invention thus enables optimal resistive random access memory cells to be obtained without necessitating any specific design, which enables forming at lower cost.

Although described through a certain number of examples, alternatives and embodiments, the forming method according to the invention and the memory cell formed by said method includes various alternatives, modifications and improvements which will appear in an obvious manner to those skilled in the art, it being understood that these alternatives, modifications and improvements fall within the scope of the invention, as defined by the following claims.

The invention claimed is:

1. A method for forming a non-volatile memory cell for switching said memory cell from an unformed state to a formed state, said memory cell including an ordered stack of a lower electrode, a layer of insulating material and an upper electrode, the method comprising
performing a breakdown operation in which at least one laser shot is emitted towards the layer of insulating material to make said layer of insulating material active by making it pass from a high resistance state to a low resistance state, the memory cell being formed when the layer of insulating material is active, several laser shots being able to be emitted successively towards the layer of insulating material with, each, a laser shot power flux density greater than the laser shot power flux density of the preceding laser shot.

2. The forming method according to claim 1, further comprising:
a) reading the memory cell,
b) detecting the formed or unformed state of said memory cell,
c) when the memory cell is in an unformed state, implementing laser shots,
d) when the memory cell is in a formed state, carrying out a post-forming cycle to place said cell in an operating state.

3. The forming method according to claim 2, wherein steps a)-c) are repeated as long as the memory cell is in an unformed state, the power flux density of the laser shot being increased at each repetition of step c).

4. The forming method according to claim 2, wherein the post-forming cycle of step d) comprises several cycles, successive and reversible, of switching between the high resistance state and the low resistance state.

5. The forming method according to claim 1, wherein the breakdown operation is carried out with a laser of a power flux density comprised between 0.06 and 0.12 W/$\mu m^2$.

6. The forming method according to claim 1, wherein the breakdown operation is carried out with a laser beam of a diameter greater than three times the width and/or the length of the memory cell.

7. The forming method according claim 1, wherein the breakdown operation is carried out with a laser in which the pulses have a duration less than or equal to 1 µs.

8. The forming method according to claim 1, wherein the breakdown operation is carried out with a laser beam emitted in a wavelength of the infrared or the ultraviolet.

9. A non-volatile memory cell including an ordered stack of a lower electrode, a layer of insulating material and an upper electrode, wherein the layer of insulating material is made active by a forming method according to claim 1 such that said layer of insulating material is capable, after forming, to switch in a reversible manner between a high resistance state and a low resistance state.

10. The non-volatile memory cell according to claim 9, wherein the upper electrode is made of titanium, the lower electrode is made of titanium nitride and the layer of insulating material is made of hafnium oxide.

11. The non-volatile memory cell according to claim 9, comprising a selection device, connected to the stack of the lower electrode, the layer of insulating material and the upper electrode, to control the current flowing in said stack.

12. A microelectronic device comprising a plurality of memory cells according to claim 9, laid out beside each other.

13. The microelectronic device according to claim 12, wherein the memory cells are laid out in a crossbar type architecture.

* * * * *